(12) United States Patent
Lin et al.

(10) Patent No.: US 11,335,635 B2
(45) Date of Patent: May 17, 2022

(54) THIN FILM RESISTORS OF SEMICONDUCTOR DEVICES

(71) Applicant: GLOBALFOUNDRIES SINGAPORE PTE. LTD., Singapore (SG)

(72) Inventors: Benfu Lin, Singapore (SG); Kah Wee Gan, Singapore (SG); Cing Gie Lim, Singapore (SG); Chengang Feng, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 71 days.

(21) Appl. No.: 16/842,956

(22) Filed: Apr. 8, 2020

(65) Prior Publication Data

US 2021/0320063 A1 Oct. 14, 2021

(51) Int. Cl.
*H01L 23/522* (2006.01)
*H01L 25/04* (2014.01)

(52) U.S. Cl.
CPC ........ *H01L 23/5228* (2013.01); *H01L 25/043* (2013.01)

(58) Field of Classification Search
CPC .............. H01L 23/5228; H01L 25/043; H01L 27/0629; H01L 27/0738; H01L 28/24
See application file for complete search history.

(56) References Cited

U.S. PATENT DOCUMENTS

| | | | |
|---|---|---|---|
| 6,497,824 B1 | 12/2002 | Chen et al. | |
| 2002/0102806 A1* | 8/2002 | Bailey | H01L 21/28044 438/384 |
| 2004/0245575 A1* | 12/2004 | Beach | H01L 23/5228 257/359 |
| 2012/0049323 A1* | 3/2012 | Ng | H01L 23/5228 257/537 |
| 2013/0093024 A1 | 4/2013 | Eshun | |
| 2019/0035878 A1* | 1/2019 | Fest | H01C 7/006 |
| 2019/0109186 A1 | 4/2019 | Leng | |
| 2019/0139861 A1* | 5/2019 | Kande | H01L 21/768 |

* cited by examiner

*Primary Examiner* — Jonathan Han
(74) *Attorney, Agent, or Firm* — Anthony Canale

(57) ABSTRACT

A semiconductor device is provided. A semiconductor device includes a first and a second region, a dielectric layer, a capping layer, and a planar resistive layer. The dielectric layer is arranged over the first and second regions and the capping layer is arranged over the dielectric layer. The capping layer has a substantially planar top surface over the first and second regions. The planar resistive layer is encapsulated within the capping layer in the first device region.

20 Claims, 5 Drawing Sheets

… (1)

THIN FILM RESISTORS OF SEMICONDUCTOR DEVICES

FIELD OF THE INVENTION

The disclosed subject matter relates generally to semiconductor devices, and more particularly to thin film resistors of semiconductor devices having improved reliability and methods of forming the same.

BACKGROUND

Resistors are a type of passive semiconductor components which are widely used in semiconductor integrated circuit devices and can be generally categorized into thick film resistors and thin film resistors.

Thin film resistors have lower temperature coefficients of resistance, lower noise, and a narrower tolerance range, whereas thick film resistors are more versatile over a wider resistance range. Thin film resistors may also possess a lower parasitic inductance and capacitance.

Thin film resistors are usually more accurate, precise, and stable than thick film resistors, which enable thin film resistors to be used in higher precision technologies, such as for measuring and monitoring equipment within the medical and aerospace sectors, audio applications, computer chips, power supply converters, telecommunications, radio-frequency (RF) applications, and precision control applications.

With technological advances in the semiconductor industry driving a need for continuous improvements to semiconductor devices, thin film resistors having improved reliability are desired.

SUMMARY

To achieve the foregoing and other aspects of the present disclosure, field-effect transistors of semiconductor devices and methods of forming the same are presented.

According to an aspect of the present disclosure, a semiconductor device is provided, which includes a first and a second region, a dielectric layer, a capping layer, and a planar resistive layer. The dielectric layer is arranged over the first and second regions and the capping layer is arranged over the dielectric layer. The capping layer has a substantially planar top surface over the first and second regions. The planar resistive layer is encapsulated within the capping layer in the first device region.

According to another aspect of the present disclosure, a method of forming a semiconductor device is provided, which includes providing a first and a second region and forming a dielectric layer over the first and second regions. A planar resistive layer is formed over the dielectric layer in the first device region. A capping layer having a substantially planar top surface is formed over the first and second regions to encapsulate the planar resistive layer within the capping layer.

According to yet another aspect of the present disclosure, a method of forming a semiconductor device is provided, which includes providing a dielectric layer and forming a planar resistive layer over the dielectric layer. A capping layer having a substantially planar top surface over the device region is formed over the dielectric layer to encapsulate the planar resistive layer within the capping layer.

BRIEF DESCRIPTION OF THE DRAWINGS

The embodiments of the present disclosure will be better understood from a reading of the following detailed description, taken in conjunction with the accompanying drawings.

Figure 1:
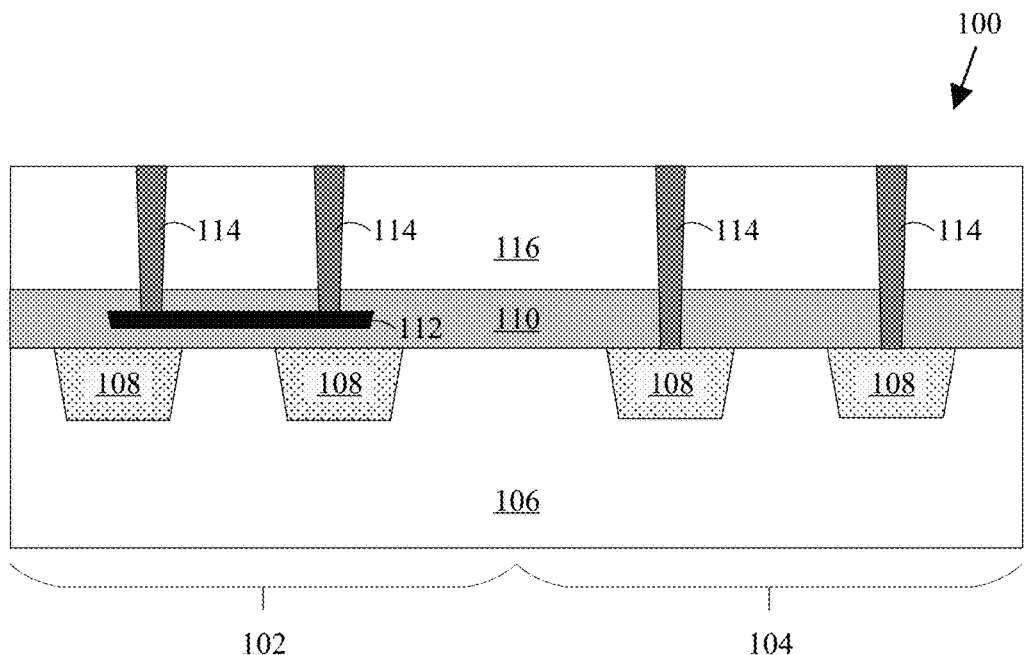
FIG. 1 is a cross-sectional view of a semiconductor device, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the device. Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The present disclosure relates to thin film resistors having improved reliability and methods of forming the same.

Also, as used herein, "deposition techniques" refer to the process of applying a material over another material (or the substrate). Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), or atomic layer deposition (ALD).

Additionally, "patterning techniques" includes deposition of material or photoresist, patterning, exposure, development, etching, cleaning, and/or removal of the material or photoresist as required in forming a described pattern, structure or opening. Exemplary examples of techniques for patterning include, but not limited to, wet etch lithographic processes, dry etch lithographic processes or direct patterning processes. Such techniques may use mask sets and mask layers with dopants having a desired conductivity type.

Various embodiments of the present disclosure are now described in detail with accompanying drawings. It is noted that like and corresponding elements are referred to by the use of the same reference numerals. The embodiments disclosed herein are exemplary, and not intended to be exhaustive or limiting to the disclosure.

FIG. 1 is a cross-sectional view of a semiconductor device 100, according to an embodiment of the disclosure. The semiconductor device 100 may be part of a semiconductor integrated circuit (IC) device and may include a first region 102 and a second region 104. The first region 102 may be a passive device region defined to form a thin film resistor (TFR) and the second region 104 may be a non-device region or an active device region defined to form other semiconductor active devices such as, but not limited to, diodes, or transistors, although those active devices are not shown in the accompanying drawings.

The semiconductor device 100 may be fabricated using a back-end-of-line scheme or a front-end-of line scheme and may include a first dielectric layer 106, at least one conductive structure 108, and a capping layer 110. The first dielectric layer 106 may serve to isolate the at least one conductive structure 108 from other adjacent conductive structures. In an embodiment of the disclosure, the first dielectric layer 106 may include a dielectric material such as, but not limited to, silicon dioxide, borophosphosilicate glass (BPSG), or undoped silicate glass (USG).

The at least one conductive structure 108 may have a top surface substantially coplanar with a top surface of the first dielectric layer 106, forming a substantially planar surface topography across the semiconductor device 100. The at least one conductive structure 108 may be a conductive feature that enables the semiconductor device 100 to be electrically coupled to other regions of the semiconductor IC device. In an embodiment of the disclosure, the at least one conductive structure 108 may include a conductive material such as, but not limited to, copper, aluminum, or tungsten.

As illustrated in FIG. 1, two conductive structures 108 are arranged in the first region 102 and two conductive structures 108 are arranged in the second region 104. It is understood that any number of conductive structures 108 may be arranged in the first region 102 and the second region 104, depending on the design of the semiconductor device 100.

The capping layer 110 may be arranged over the first dielectric layer 106 and the at least one conductive structure 108. The capping layer 110 may have a substantially uniform thickness and a substantially planar top surface across the first region 102 and the second region 104. The capping layer may form a substantially planar surface topography across the semiconductor device 100.

The capping layer 110 may be a single-layered dielectric material or a multi-layered dielectric material. The capping layer 110 may serve to prevent electro-migration and/or oxidation of conductive material from the at least one conductive structure 108. In an embodiment of the disclosure, the capping layer 110 may include a dielectric material such as, but not limited to, silicon nitride, silicon carbonitride, silicon carbide, or combinations thereof. Other dielectric capping materials known in the art may also be employed.

A planar resistive layer 112 may be embedded in the capping layer 110 in the first region 102. The planar resistive layer 112 may include a resistive material such as a transition metal alloy, for example, silicon chromium (SiCr), nickel chromium (NiCr), silicon carbide chromium (SiCCr), tantalum nitride (TaN), tantalum silicon nitride (TaSiN), aluminum-doped nickel chromium (AlNiCr), titanium nickel chromium (TiNiCr), or combinations thereof. Other resistive materials known in the art may also be employed. In an embodiment of the disclosure, the planar resistive layer 112 may be a thin film resistor (TFR).

The semiconductor device 100 may additionally include a second dielectric layer 116 arranged over the capping layer 110. The semiconductor device 100 may further include at least one contact 114 to conductively couple the TFR 112 to other regions of the semiconductor IC device. The at least one contact 114 may be arranged in the second dielectric layer 116. In an embodiment of the disclosure, the at least one contact 114 may include a conductive material such as, but not limited to, copper or tungsten.

It is understood that the TFR 112 may not necessarily be arranged over the at least one conductive structure 108. It is further understood that the disclosed embodiment of the TFR 112 in FIG. 1 is just one of the possible conductive coupling of the TFR 112 to other regions of the semiconductor IC device. The TFR 112 may take on other conductive couplings without departing from the spirit and scope of the present disclosure.

Additional contacts 114 may be formed in the second region 104 to conductively couple the conductive structures 108 in the second region 104 to other regions of the semiconductor IC device.

FIGS. 2A to 2D are cross-sectional views of the semiconductor device 100, illustrating a method of forming the semiconductor device 100, according to embodiments of the disclosure. Certain structures may be conventionally fabricated, for example, using known processes and techniques, and specifically disclosed processes and methods may be used to achieve individual aspects of the present disclosure.

Figure 2A:
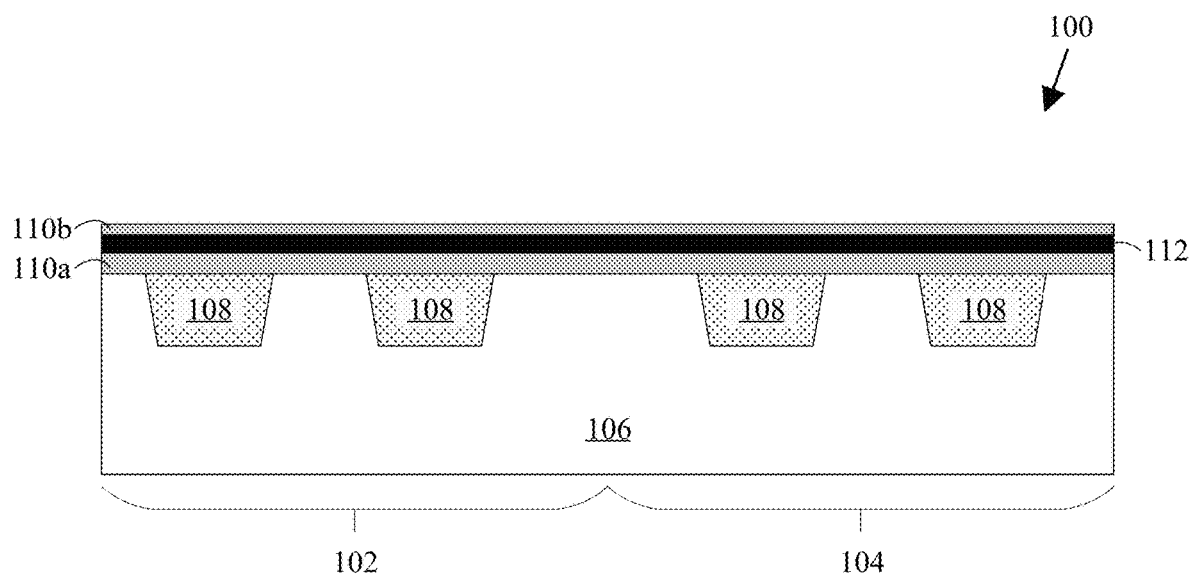
FIGS. 2A to 2D are cross-sectional views of a semiconductor device, illustrating a method of fabricating the semiconductor device, according to alternative embodiments of the disclosure.

As illustrated in FIG. 2A, a first dielectric layer 106 is provided. The first dielectric layer 106 may be deposited over a substrate (not shown) and may be a pre-metal dielectric (PMD) layer or an interlayer dielectric (ILD) layer.

At least one conductive structure 108 may be formed in the first dielectric layer 106. The at least one conductive structure 108 may be formed in the first region 102 and/or the second region 104. The at least one conductive structure 108 may be a via structure, a line structure, or a combination of via and line structures. In an embodiment of the disclosure, the at least one conductive structure 108 may have a top surface substantially coplanar with a top surface of the first dielectric layer 106, as illustrated in FIG. 2A. In another embodiment of the disclosure, the at least one conductive structure may extend through the first dielectric layer 106, although this embodiment is not shown in the accompanying drawings.

The at least one conductive structure 108 may be formed by providing at least one opening (not shown) in the first dielectric layer 106 using various patterning techniques and filling the at least one opening with a conductive material using various deposition techniques to form the at least one conductive structure 108. The at least one conductive structure 108 may be planarized using a planarization process, such as a chemical-mechanical planarization (CMP) process, to form the at least one conductive structure 108 having a top surface substantially coplanar with a top surface of the first dielectric layer 106, i.e., achieving a substantially planar surface topography across the semiconductor device 100.

A second dielectric layer 110a, a resistive layer 112, and a third dielectric layer 110b may be sequentially deposited in the first region 102 and the second region 104, specifically over the first dielectric layer 106 and the at least one conductive structure 108, using various deposition techniques. The second and third dielectric layers (110a and 110b, respectively) may include a suitable capping material such as, but not limited to, silicon nitride, silicon carbonitride, silicon carbide, or combinations thereof. Other dielectric capping materials known in the art may also be employed. The second and third dielectric layers (110a and 110b, respectively) may not necessarily include the same capping material.

The second and third dielectric layers (110a and 110b, respectively) may be deposited using a deposition technique, for example, a CVD process. The resistive layer 112 may be deposited using another deposition technique, for example, a PVD process or a sputtering process. The resistive layer 112 may have a thickness and a composition that is dependent on the desired resistor parameter, for example, the resistance value.

Figure 2B:
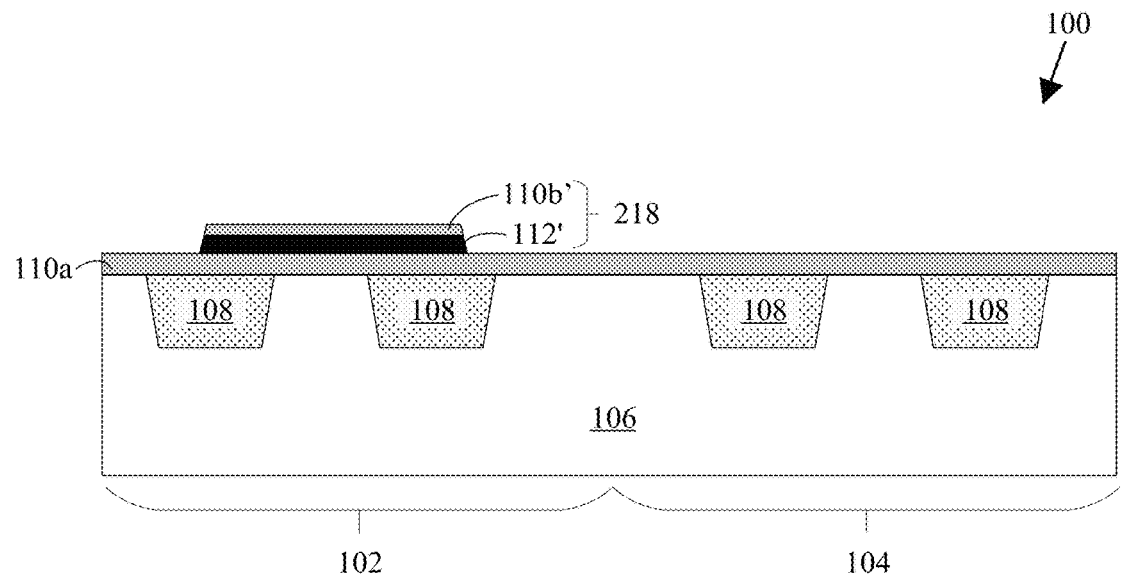

FIG. 2B illustrates the semiconductor device 100 after forming a patterned stack 218 in the first region 102, according to an embodiment of the disclosure. The patterned stack 218 may be formed using various patterning techniques. The patterned stack 218 may include a patterned resistive layer 112' and a patterned third dielectric layer 110b' arranged over the patterned resistive layer 112'. The third dielectric layer 110b may serve to protect the resistive layer 112 during the patterning process to form the patterned resistive layer 112'. In an embodiment of the disclosure, the patterned resistive layer 112' has a substantially planar surface topography and may serve as a TFR for the semiconductor device 100.

In an embodiment of the disclosure, the patterned stack 218 may be formed by removing portions of the resistive layer 112 and portions of the third dielectric layer 110b. As a result, the surface topography across the semiconductor device 100 may be characterized by the patterned stack 218 protruding above the second dielectric layer 110a. It is preferable to leave at least a portion of the second dielectric layer 110a over the first dielectric layer 106 and the at least one conductive structure 108; the second dielectric layer 110a may serve to protect any underlying features during the formation of the patterned stack 218.

Figure 2C:
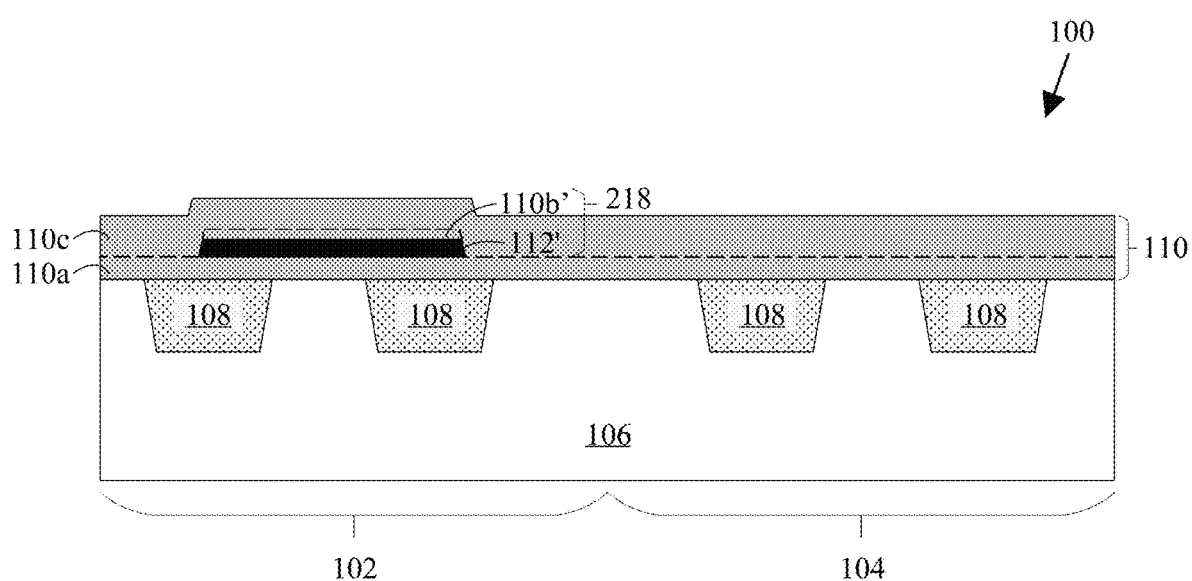

FIG. 2C illustrates the semiconductor device 100 after depositing a fourth dielectric layer 110c, according to an embodiment of the disclosure. The fourth dielectric layer 110c may be deposited over the first and second device regions (102 and 104, respectively), including over the patterned stack 218, using various deposition techniques, for example, a CVD process. The fourth dielectric layer 110c may be deposited to a height above the patterned resistive layer 112'.

As the surface topography across the semiconductor device 100 may be non-planar due to the protruding patterned stack 218, the fourth dielectric layer 110c follows the surface topography and acquires a non-planar surface topography. The interface between the fourth dielectric layer 110c and the second and third dielectric layers (110a and 110b, respectively) are demarcated by a dashed line.

The fourth dielectric layer 110c may include a similar capping material as the second and third dielectric layers (110a and 110b, respectively). The second, third, and fourth dielectric layers (110a, 110b, and 110c, respectively) may serve as a capping layer for the semiconductor device 100 and are synonymous to the capping layer 110 in FIG. 1.

Figure 2D:
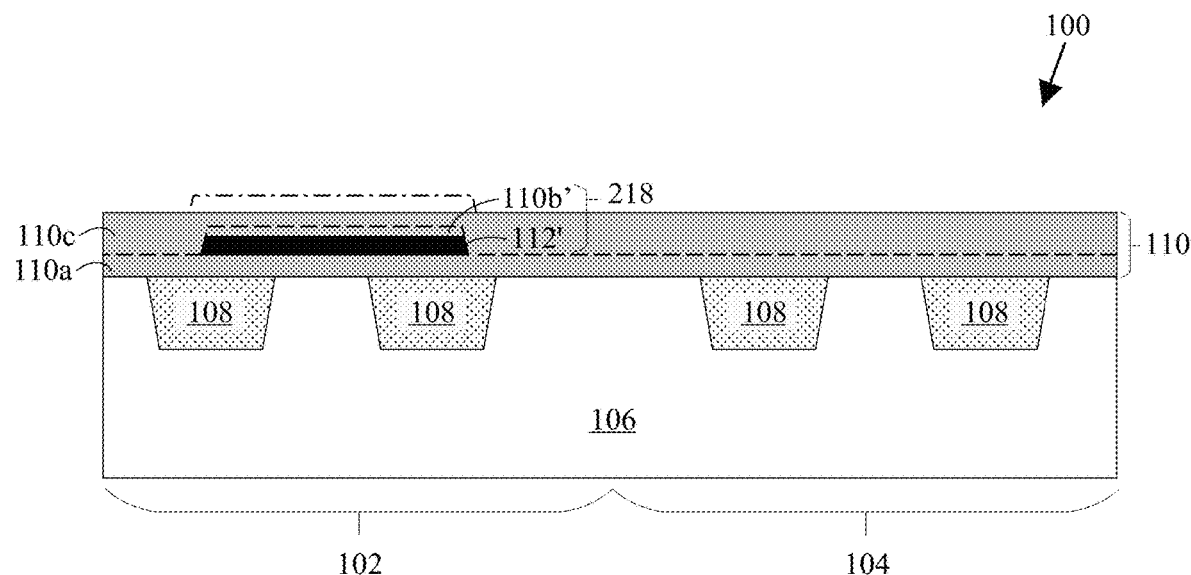

FIG. 2D illustrates the semiconductor device 100 after a planarization process, according to an embodiment of the disclosure. The semiconductor device 100 may be planarized using various planarization techniques. The planarization process forms a substantially planar surface topography across the semiconductor device 100; the fourth dielectric layer 110c having a substantially planar top surface over the first region 102 and the second region 104. The planarization process removes any non-planar surface topography due to the protruding patterned stack 218; the portions of the patterned stack 218 removed by the planarization process is demarcated by a dash-dot line.

In an embodiment of the disclosure, the planarization process employed may be a CMP process and may be performed using an exemplary process described herein. The surface topography across the semiconductor device 100 may be measured and by calculating the removal rate of the fourth dielectric material, the CMP process may be time-controlled to remove a desired thickness of the fourth dielectric layer 110c to achieve a substantially planar surface topography. It is an objective of this disclosure that at least a portion of the third dielectric layer 110b remains over the patterned resistive layer 112' and that the patterned resistive layer 112' is not exposed after the CMP process, i.e., the patterned resistive layer 112' is encapsulated within the second, third, and fourth dielectric layers (110a, 110b, and 110c, respectively).

In another embodiment of the disclosure, the planarization process employed may be an etching process and may be performed using an exemplary process described herein. A patterning layer, such as a photoresist layer, a hard mask layer, or a combination thereof, may be deposited over the semiconductor device 100. An opening that is aligned over the protruding patterned stack 218 may be formed in the patterning layer using various patterning techniques. The etching process may employ suitable etchant to remove the portions of the fourth dielectric layer 110c to achieve a substantially planar surface topography across the semiconductor device 100. As disclosed earlier, it is an objective of this disclosure that at least a portion of the third dielectric layer 110b remains over the patterned resistive layer 112' and that the patterned resistive layer 112' is not exposed after the etching process, i.e., the patterned resistive layer 112' is encapsulated within the second, third, and fourth dielectric layers (110a, 110b, and 110c, respectively).

The semiconductor device 100 may undergo further fabrication steps to form at least one contact 114. Methods of forming contacts are well known in the art and may be performed using an exemplary process described herein. A fifth dielectric layer 116 may be deposited over the fourth dielectric layer 110c in the first region 102 and the second region 104. The at least one contact 114 may be formed by providing at least one opening in the fifth dielectric layer 116 over the patterned resistive layer 112' using various patterning techniques and filling the at least one opening with a conductive material using various deposition techniques to form the at least one contact 114 over the patterned resistive layer 112'. The at least one contact 114 may be planarized using a planarization process, such as a CMP process, to form the at least one contact 114 having a top surface substantially coplanar with a top surface of the fifth dielectric layer 116, as illustrated in FIG. 1.

Figure 3A:
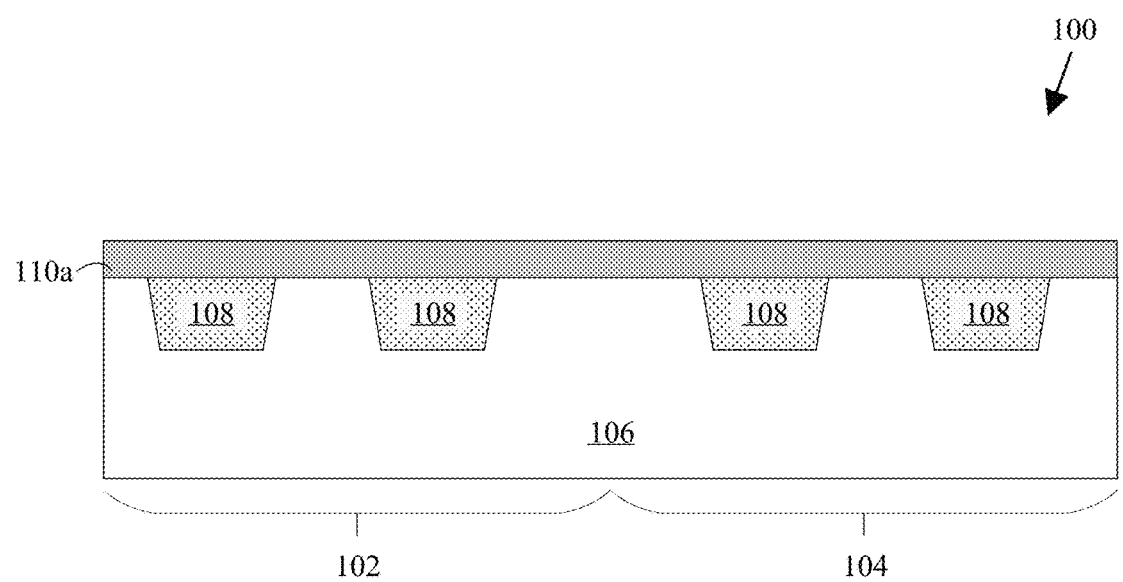
FIGS. 3A to 3E are cross-sectional views of a semiconductor device, illustrating a method of fabricating the semiconductor device, according to alternative embodiments of the disclosure.

FIGS. 3A to 3E are cross-sectional views of the semiconductor device 100, illustrating a method of forming the semiconductor device 100, according to alternative embodiments of the disclosure. As illustrated in FIG. 3A, a first dielectric layer 106 is provided in a first region 102 and a second region 104 of the semiconductor device 100. Similarly to the embodiment described in FIG. 2A, the first dielectric layer 106 may be deposited over a substrate (not shown) and may be a pre-metal dielectric (PMD) layer or an interlayer dielectric (ILD) layer.

At least one conductive structure 108 may be formed in the first dielectric layer 106. The at least one conductive structure 108 may be formed in the first region 102 and/or the second region 104. The first dielectric layer 106 and the at least one conductive structure 108 may form a substantially planar surface topography across the semiconductor device 100.

A second dielectric layer 110a may be deposited over the semiconductor device 100 in the first region 102 and the second region 104 using various deposition techniques, for example, a CVD process. The embodiment of the second dielectric layer 110a in FIG. 3A may be deposited with a thickness that is greater than the embodiment of the second dielectric layer 110a in FIG. 2A. The second dielectric layer 110a in FIG. 3A may be deposited to a thickness that considers a thickness of the resistive layer that is to be formed therein.

Figure 3B:
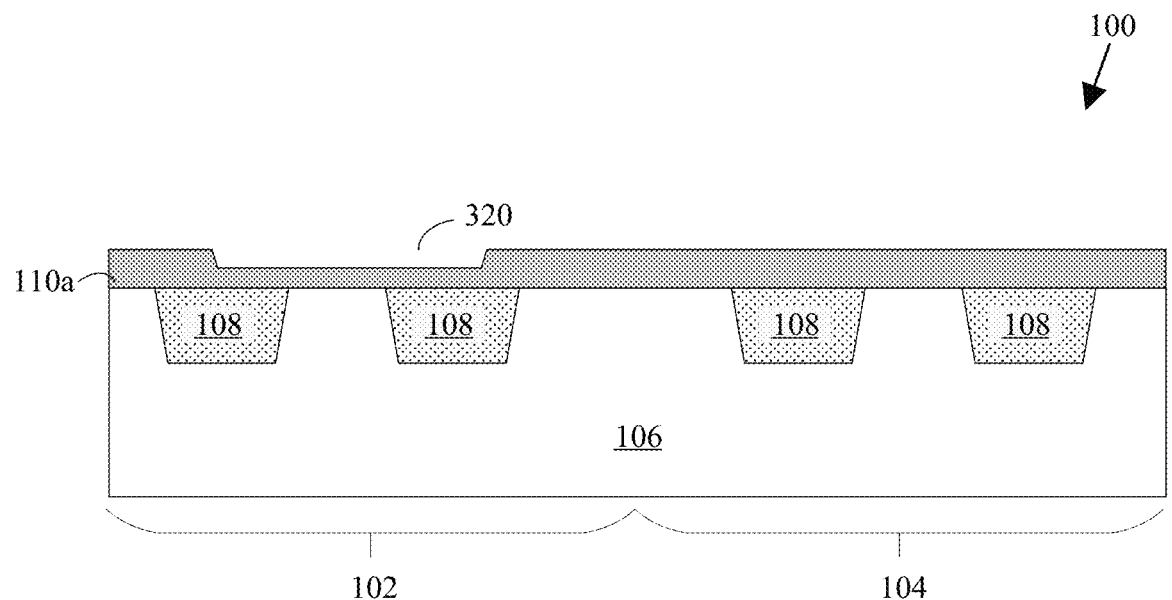

FIG. 3B illustrates the semiconductor device 100 after forming a trench 320 in the second dielectric layer 110a, according to an embodiment of the disclosure. The trench 320 may be formed using various patterning techniques. For example, a patterning layer such as a photoresist layer, a hard mask layer, or a combination thereof, may be deposited over the semiconductor device 100 and an opening may be formed in the patterning layer using various patterning techniques.

A material removal process, for example, an etching process, may be employed to remove a portion of the second dielectric layer 110a to form the trench 320. As a result, the surface topography across the semiconductor device 100 may be characterized by a depression formed in the second dielectric layer 110a by the trench 320. It is an objective of this disclosure that the trench 320 does not extend through the second dielectric layer 110a and that a portion of the second dielectric layer 110a lines a bottom of the trench 320.

Figure 3C:
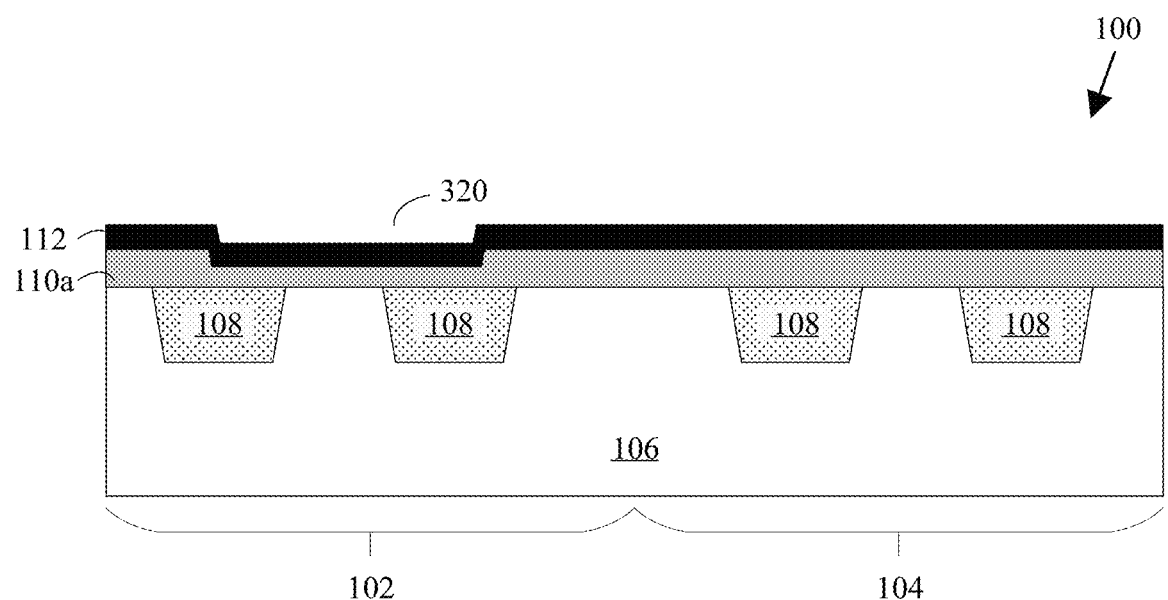

FIG. 3C illustrates the semiconductor device 100 after depositing a resistive layer 112, according to an embodiment of the disclosure. The resistive layer 112 may be deposited over the first region 102 and the second region 104 and fills the trench 320. As the surface topography across the semiconductor device 100 may be non-planar due to the formation of trench 320, the resistive layer 112 follows the surface topography and acquires a non-planar top surface.

Figure 3D:
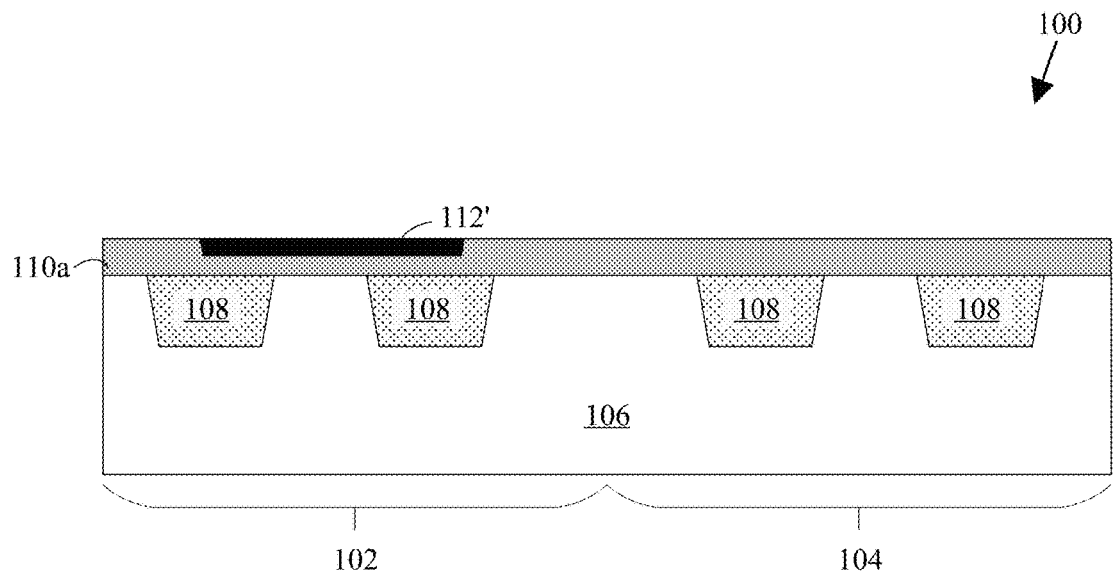

FIG. 3D illustrates the semiconductor device 100 after forming a planar resistive layer 112', according to an embodiment of the disclosure. The semiconductor device 100 may be planarized using various planarization techniques, for example, a CMP process, to form the planar resistive layer 112'. The planarization process may form the planar resistive layer 112' having a top surface that is substantially coplanar with a top surface of the second dielectric layer 110a. The surface topography of the semiconductor device 100 may be substantially planar after the planarization process.

Figure 3E:
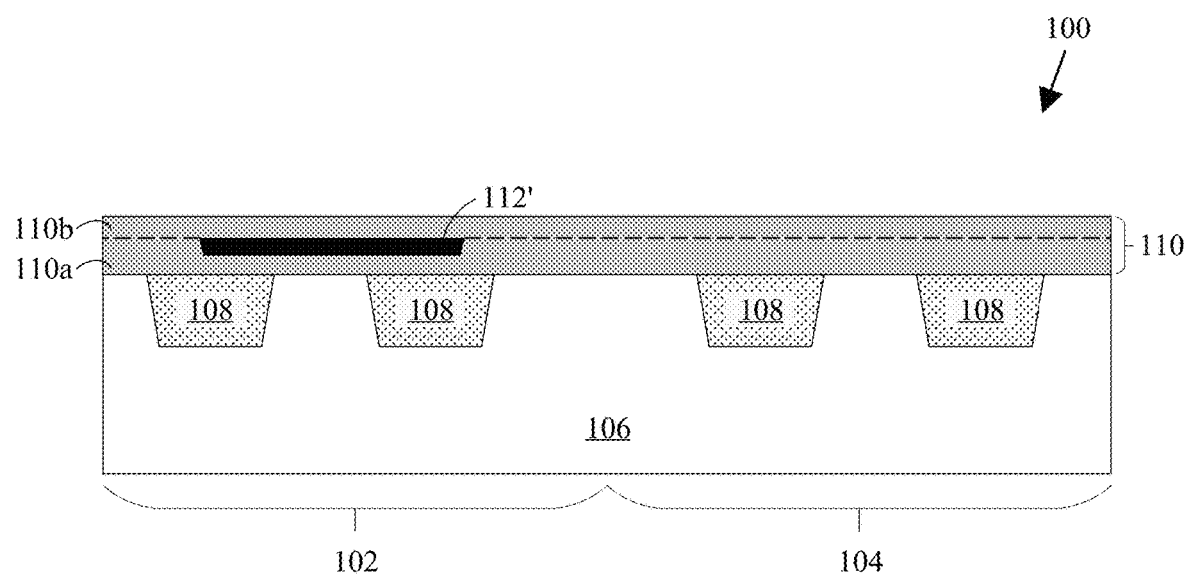

FIG. 3E illustrates the semiconductor device 100 after depositing a third dielectric layer 110b, according to an embodiment of the disclosure. The third dielectric layer 110b may be deposited over the first region 102 and the second region 104, including over the planar resistive layer 112', using various deposition techniques, for example, a CVD process. The second and third dielectric layers (110a and 110b, respectively) may serve as a capping layer for the semiconductor device 100 and are synonymous to the capping layer 110 in FIG. 1.

The third dielectric layer 110b follows the surface topography across the semiconductor device 100 and the third dielectric layer 110b may be deposited with a substantially planar top surface over the first region 102 and the second region 104. The interface between the second and third dielectric layers (110a and 110b, respectively) is demarcated by a dashed line.

The semiconductor device may undergo further fabrication steps to form at least one contact 114 to at least conductively couple the planar resistive layer 112' to other regions of the semiconductor IC device, as similarly illustrated in FIG. 1.

As presented in the above disclosure, TFRs having improved reliability and methods of forming the same are presented. The TFR may be encapsulated within a capping layer and the capping layer may have a substantially uniform thickness across a semiconductor device. The capping layer may form a substantially planar surface topography across the semiconductor device.

The substantially planar surface topography across the semiconductor device advantageously lowers any potential shear stress generated at interfaces between the capping layer and an upper dielectric layer. High shear stress may be generated at interfaces of protruding device features due to a mismatch of the coefficient of thermal expansions of different materials, especially at corners of the protruding device features where higher shear stress tends to be generated. This high shear stress potentially lowers the reliability of a semiconductor device as the semiconductor device may be susceptible to delamination at the interfaces.

By forming a substantially planar surface topography over the semiconductor device, i.e., the TFR being encapsulated within a capping layer having a substantially planar top surface across the semiconductor device, the generated shear stress gradient may be minimized to reduce any potential delamination and thereby effectively improve the reliability of the encapsulated TFR.

The terms "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A semiconductor device comprising:
 a first region and a second region;
 a dielectric layer in the first and second regions;
 a capping layer over the dielectric layer, the capping layer having a substantially planar top surface, wherein the capping layer comprises a different dielectric material than the dielectric layer; and a planar resistive layer encapsulated within the capping layer in the first region.

2. The semiconductor device of claim 1, wherein the planar resistive layer is a thin film resistor.

3. The semiconductor device of claim 1, wherein the planar resistive layer comprises a transition metal alloy.

4. The semiconductor device of claim 3, wherein the transition metal alloy comprises silicon chromium.

5. The semiconductor device of claim 3, wherein the transition metal alloy comprises tantalum nitride.

6. The semiconductor device of claim 1, further comprising at least one contact over the planar resistive layer.

7. A method of forming a semiconductor device comprising:

forming a dielectric layer over a first region and a second region of the semiconductor device;

forming a planar resistive layer over the dielectric layer in the first region; and forming a capping layer over the first region and the second region to encapsulate the planar resistive layer, wherein the capping layer is of a different dielectric material than the dielectric layer and has a substantially planar top surface over the first region and the second region.

8. The method of claim 7, wherein forming the capping layer further comprises:

depositing a first portion of the capping layer over the dielectric layer;

forming the planar resistive layer over the first portion of the capping layer; and depositing a second portion of the capping layer over the planar resistive layer, wherein the first portion and the second portion of the capping layer are deposited over the first region and the second region.

9. The method of claim 8, wherein the second portion of the capping layer is deposited to a height above the planar resistive layer.

10. The method of claim 8, wherein forming the planar resistive layer further comprises:

depositing a layer of resistive material over the first portion of the capping layer; and patterning the layer of resistive material to form the planar resistive layer.

11. The method of claim 9, further comprising planarizing the second portion of the capping layer to form a substantially planar surface topography across the first region and the second region.

12. The method of claim 7, wherein forming the capping layer further comprises:

depositing a first portion of the capping layer over the dielectric layer;

forming a trench in the first portion of the capping layer;

forming the planar resistive layer in the trench; and depositing a second portion of the capping layer over the planar resistive layer, wherein the first portion and the second portion of the capping layer are deposited over the first region and the second region.

13. The method of claim 12, wherein forming the planar resistive layer in the trench further comprises:

depositing a layer of resistive material over the first region and the second region to fill the trench; and planarizing the layer of resistive material to form the planar resistive layer in the trench, wherein the planar resistive layer and the first portion of the capping layer forms a substantially planar surface topography across the first region and the second region.

14. The method of claim 7, further comprising forming at least one contact over the planar resistive layer.

15. A method of forming a semiconductor device comprising:

providing a device region on the semiconductor device;

forming a dielectric layer over the device region;

forming a planar resistive layer over the dielectric layer; and forming a capping layer over the dielectric layer to encapsulate the planar resistive layer, wherein the capping layer is of a different dielectric material than the dielectric layer and has a substantially planar top surface over the device region.

16. The method of claim 15, wherein forming the capping layer further comprises:

depositing a first portion of the capping layer over the dielectric layer; and depositing a second portion of the capping layer over the planar resistive layer.

17. The method of claim 16, wherein depositing the second portion of the capping layer forms a substantially planar top surface across the semiconductor device.

18. The method of claim 16, wherein forming the planar resistive layer further comprises:

forming a trench in the first portion of the capping layer;

filling the trench with a resistive material; and planarizing the resistive material to form the planar resistive layer having a top surface substantially coplanar with a top surface of the first portion of the capping layer.

19. The method of claim 15, wherein forming the planar resistive layer further comprises:

depositing a layer of resistive material over the dielectric layer; and etching the layer of resistive material to form the planar resistive layer.

20. The method of claim 15, further comprising:

forming a contact over the planar resistive layer, wherein the contact conductively couples the planar resistive layer.

* * * * *